(12) United States Patent
Hutton

(10) Patent No.: US 7,607,118 B1
(45) Date of Patent: *Oct. 20, 2009

(54) TECHNIQUES FOR USING EDGE MASKS TO PERFORM TIMING ANALYSIS

(75) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 192 days.

This patent is subject to a terminal disclaimer.

(21) Appl. No.: 11/475,843

(22) Filed: Jun. 26, 2006

Related U.S. Application Data

(63) Continuation of application No. 10/718,978, filed on Nov. 20, 2003, now Pat. No. 7,093,219.

(51) Int. Cl.
*G06F 17/50* (2006.01)

(52) U.S. Cl. .......................................... 716/16; 716/12

(58) Field of Classification Search ................ 716/6, 716/12–14, 16
See application file for complete search history.

(56) References Cited

U.S. PATENT DOCUMENTS 5,355,321 A * 10/1994 Grodstein et al. .............. 716/6
5,581,474 A * 12/1996 Bamji et al. ................... 716/2
6,286,126 B1 * 9/2001 Raghavan et al. .............. 716/6
6,836,753 B1 * 12/2004 Silve ............................. 703/2

OTHER PUBLICATIONS

Blaauw, D., et al., "Removing user-specified false paths from timing graphs", ACM, 2000, pp. 270-273.*

* cited by examiner

*Primary Examiner*—Stacy A Whitmore
(74) *Attorney, Agent, or Firm*—Townsend and Townsend and Crew LLP

(57) ABSTRACT

Techniques are provided for more efficient timing analysis of user designs for programmable ICs. Initially, a graph is created that represents nodes and edges in a user design. Each edge in the graph is assigned a binary edge mask, each bit of which indicates whether it is reachable from a source or destination type relevant to user specified timing constraints. A timing analysis tool then performs multiple depth-first search operations to compute delays along time critical paths relevant to the user specified timing constraints. Because each edge contains an edge mask to indicate whether it connects to a particular source or destination point, the timing analysis tool does not analyze areas of the graph that do not lead to a relevant source or destination point. These techniques prevent the timing analysis tool from analyzing paths in the graph that are not relevant to the analysis of the time critical paths.

60 Claims, 4 Drawing Sheets

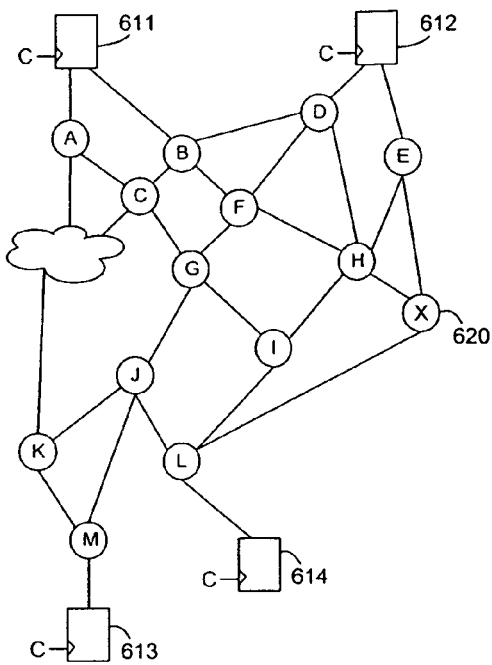
FIG. 6A
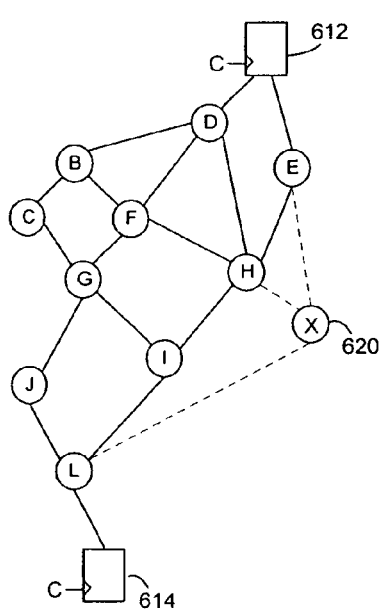 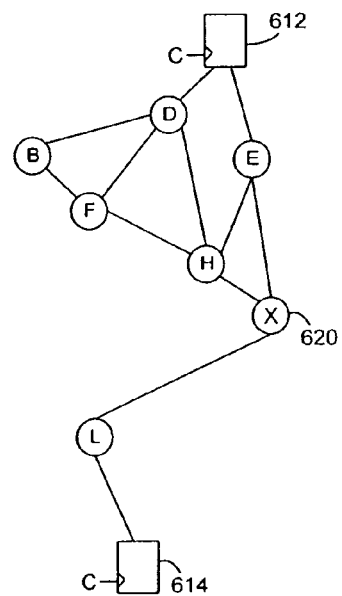
FIG. 6B FIG. 6C

TECHNIQUES FOR USING EDGE MASKS TO PERFORM TIMING ANALYSIS

BACKGROUND OF THE INVENTION

The present invention relates to techniques for performing timing analysis of a user design for a programmable integrated circuit, and more particularly, to techniques for determining whether a placement for a user design satisfies timing constraints without analyzing unnecessary timing paths by using edge masks.

A programmable integrated circuit (IC) is a circuit that contains numerous programmable circuit elements called logic blocks or logic elements. The logic blocks can be programmed to implement a variety of logic functions. Programmable ICs also include memory blocks and programmable routing resources that can be programmed to connect the memory blocks and logic elements.

Programmable ICs include field programmable gate arrays (FPGAs), programmable logic devices (PLDs), programmable logic arrays (PLAs), configurable logic arrays, mask programmable logic devices, etc. Programmable integrated circuits can also contain hardwired circuit blocks that are not programmable.

A programmable IC as a whole can be programmed according to a circuit schematic designed by a user (i.e., a user design). The user design is initially converted into a network of abstract logic elements that can be mapped directly onto the programmable IC. The conversion process is referred to as synthesis.

Actual logic elements on the programmable IC are then identified to implement the abstract logic elements generated during synthesis. This identification process is referred to as placement. Subsequently, the programmable routing resources are programmed to connect together the logic elements during a routing process.

Typically a user specifies timing constraints that are intended to regulate the operation of a programmable IC user design. The timing constraints are time limits that indicate the minimum allowable clock speeds or maximum allowable point-to-point delays for various portions of the user design.

The placement process greatly affects timing delays in the user design. If two logic elements that are connected together in the user design along a time critical path are placed far apart from each other on the programmable IC, the delay for a signal to pass between these two logic elements may exceed one of the user's timing constraints.

Once a user design has been placed onto the logic elements during the placement process timing analysis is performed on the user design. Timing analysis uses either breadth-first search (BFS) or depth-first search (DFS) techniques. The goal of the analysis is to identify maximum delay paths between selected source points and destination points in a user circuit design relative to each constraint or constraint type. A critical path is a directed path in the placed design that has the longest signal delay time from a source point to a destination point either in absolute terms or relative to its constraint.

Breadth-first search is more advantageous for minimizing the additional work required to visit nodes which are not relevant to a computation. However, BFS must propagate multiple delay values per node, and this can significantly increase computer memory use. Recursive DFS can mitigate memory use, but can require searching more of the netlist than BFS, and is thus computationally more expensive.

Timing analysis also involves calculating slack and relative slack or slack ratio for certain timing critical circuit paths in the user design. These values are used to aid the placement tool. If the timing delay along one or more of the time critical paths exceeds the user's timing constraints, some or all of the user design is placed into different logic elements on the programmable IC to improve the timing delay of the user design.

Performing depth first searches through a very large number of circuit paths and interconnections in a user design for a programmable IC can be time consuming. When a depth first search is performed on a user design, the timing analysis tool does not know which circuit paths will lead to the source point or the destination point. Therefore, timing analysis tools analyzes all circuit paths that lead in a particular direction during a depth first search.

Therefore, it would be desirable to provide faster and more efficient techniques for performing timing analysis of placed user designs for programmable ICs. The present invention provides a technique to improve the time taken by DFS to allow comparable time-complexity to BFS without the additional memory overhead, and further provides other beneficial properties.

BRIEF SUMMARY OF THE INVENTION

The present invention includes techniques for providing more efficient timing analysis of user designs for programmable ICs. Initially, a graph is created that represents nodes and edges in a user design that has been placed on a programmable IC. Each edge in the graph is assigned a binary edge mask, each bit of which indicates whether it is reachable from a source type or a destination type that is relevant to user specified timing constraints.

A timing analysis tool then performs multiple depth-first search operations to compute delays along time critical paths relevant to the user specified timing constraints. The time critical paths traverse nodes and edges in the graph between source and destination points relevant to the user specified timing constraints.

Because each edge contains an edge mask to indicate whether it connects to a particular source or destination point, the timing analysis tool does not analyze areas of the graph that do not lead to a relevant source or destination point. These techniques prevent the timing analysis tool from analyzing paths in the graph that are not relevant to the analysis of the time critical paths. The present invention saves time and processing resources.

In other embodiments of the present invention, edge masks are used to efficiently solve the thru-x constraint and k-paths problems. In a further embodiment, a method for using edge masks to modify a placement and routing CAD flow is provided.

Though described in terms of programmable logic devices, it should be clear to one skilled in the art that the techniques described herein are broadly applicable to gate-arrays, Application Specific Integrated Circuits (ASICs), and to range of timing analysis tools.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 6A-6C are examples of graphs of a user design for a programmable integrated circuit illustrating edge-masks annotating the processing of a thru-x multicycle constraint according to the principles of the present invention.

DETAILED DESCRIPTION OF THE INVENTION

A placement tool is a software tool that places a user design onto a programmable IC. During placement, circuit elements in the user design are assigned to actual logic elements and other circuit elements on the programmable IC. A timing analysis tool calculates timing delays between logic elements and other circuit elements in the placed user design.

If two logic elements are connected in the user design, but they are placed far apart from each other on the device, the signal delay for paths containing these two logic elements will be long and the delay may exceed a timing constraint that the user has specified for the design. Therefore, timing analysis is performed on a placed user design to determine if timing paths satisfy the user's constraints.

Figure 1:
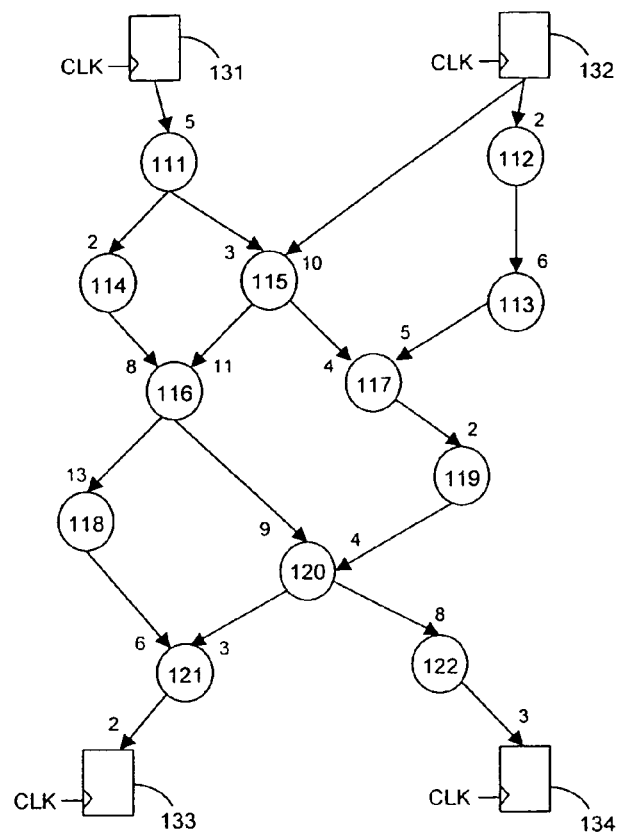
FIG. 1 is an example of a graph that represents a user design for a programmable integrated circuit.

FIG. 1 illustrates how a placed user design for a programmable IC can be represented as a timing graph. Timing analysis is performed using the graph to determine whether the placed user design satisfies the user's timing constraints. If the placed user design does not satisfy the user's timing constraints, the placement tool has to re-locate at least part of the user design into different logic elements to improve critical signal delays, or the user has to restructure the design to minimize the number of connections on the critical path.

The graph shown in FIG. 1 represents a portion of a user design for a programmable integrated circuit. The arrows in the graph are edges. The edges represent wires. Signals propagate through the wires in the direction of the arrows from source registers 131 and 132 to destination registers 133 and 134. Other nodes (e.g. 111, 122) in the graph represent circuit elements (e.g., a multiplexer or a register) that connect together two or more edges. A common clock-signal CLK controls registers 131-134. Though not shown in this example, an output from register 134 could pass through multiple other nodes and then drive register 131, generating a timing path in which 134 is a source register and 131 a destination. In a synchronous circuit, a directed cycle in the timing graph is only allowed if it passes through at least one register.

The user design represented by the graph in FIG. 1 will have timing constraints associated with registers 131-134. For example, one timing constraint may be that the maximum delay for signals to propagate from register 131 to register 133 is 40 nanoseconds (ns). Another timing constraint may be that the maximum delay for signals to propagate from register 132 to register 134 is 50 ns. These timing constraints are based on the frequency of clock signal CLK or, since in this case the registers use the same clock, other exogenous factors.

A timing delay is associated with each edge and each node in a graph that represents a user design for a programmable IC. The numbers outside each node in FIG. 1 represent the time (in ns) for a signal to pass from the input of the previous node through the edge to the input of the current node. In this example, nodes themselves are considered to have no delay, though in general all elements in the circuit have delay.

A longest delay path is a path that has maximum delay between a source and destination register. It is not necessarily true that the longest path is the most important or critical path in the graph. For example, a path with delay 10 and constraint 9 (slack 1) is more critical than a path with delay 10 and constraint 30 (slack 20). The term slack ratio (slack/constraint) is often used to quantify this relative slack. In the former case slack-ratio on the path is $1/10$ or 0.1 and in the latter slack-ratio is $10/30$ or 0.33. Smaller (including negative) slack ratio indicates more critical paths. Edges in the graph can be annotated with the most critical slack ratio of any path which passes that edge. A path (edge) with the minimum slack ratio is considered a critical path (edge) in the graph.

Pseudocode of a well-known algorithm A for performing a slack-based timing analysis for a single clock domain is given below. Algorithm A uses a depth-first search to calculate the forward and backward delays, slack and slack ratio in a user design.

Algorithm A:

Compute strongly-connected components (SCC) to collapse and isolate comb. Cycles For each destination, DFS destination to source:

On the way back, compute delay to source.

For each source, DFS source to destination:

On the way back, compute delay to destination.

For each timing arc:

Max_path_delay=delay(node)+$d2src$+$d2src$+$d2dest$

Slack=constraint−max_path_delay

Slack_ratio(node)=slack/constraint

Algorithm A visits each node in the graph at most a constant (independent of the size of the graph) number of times, and concludes with annotation on each node and edge giving the delay of the longest path from a source register and to a destination register in the graph, and then a slack and slack ratio using the most stringent constraint for that path.

Using the edge between nodes 115 and 116 as an example, the above method would label the longest path from a source to 115 to be of delay 10 (132 to 115), and the longest delay from 116 to a destination to be delay 21 (116 to 118 to 121 to 133). Thus the length of the longest path including edge (115,116) is 10+11+21=42 units of delay. If the global constraint on the graph is 50 units, then the slack is 50−42=8, and the slack ratio $8/50$=0.16.

A difficulty occurs when the constraint placed on the paths in the graph is not uniform. Suppose the requirement for paths from 131 to 133 is 40 and the requirement from node 132 to 134 is 50. Then the slack ratio of edge (115,116) relative to the 131-133 constraint is (40−40)/40=0, while the slack ratio of the edge (115,116) relative to (132,134) is (50−41)/50=0.18. Worse, the delay stored as part of a depth-first search at 115 is not unique. It is 10 for the 132-134 path and 8 for the 131-133 path.

Pseudocode for an algorithm B for performing timing analysis in two clock-domains is given below. Algorithm B uses a depth-first search to calculate the forward and backward delays, slack and slack ratio in a user design with multiple clocks.

Algorithm B:
   Preprocess SCC as in Algorithm A for the single clock
      domain timing analysis given in the pseudocode above
   For each destination x of clock 1
      Execute the DFS of Algorithm A to source in clock 1
   For each source x of clock 1
      Execute the DFS of Algorithm A to source in clock 1
   For each node marked by both of these traversals
      Execute the slack calculations of Algorithm A Using algorithm B, the first DFS calculates delays along the path through node 133 to source nodes 131 and 132. The delay from register 132 is then discarded because it is not relevant to the current calculation. In subsequent processing of the 134 to 132 the opposite holds, and the 131 to 115 delay is discarded. Thus the calculation is correct but inefficient.

Figure 3:
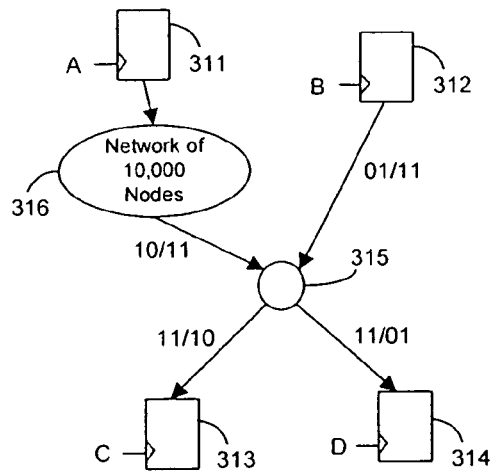
FIG. 3 is another example of a graph of a user design for a programmable integrated circuit that contains edge nodes according to the principles of the present invention.

Consider the graph of FIG. 3. Algorithm B must traverse the entire network of nodes 316 before determining that the delay value passed back along edge (316,315) is not relevant to, for example, the 312 to 314 paths clocked by clocks B and D. The delay is calculated because there is no way to determine, until reaching the source register, that it is not relevant to the current calculation. This is a general drawback of the DFS approach.

An alternative to algorithms A and B is to use a breadth-first search from sources to destinations. This is preceded by a levelization step (using either algorithm A or a breadth-first levalization). The operation involves placing all primary inputs in a queue, then processing nodes in the queue iteratively until all nodes have been processed. To process each node, it is required to update each of a list of constraint types. This method requires memory to be allocated to store this information at each node. The amount of memory for each node is proportional to the number of source or destination types to which the node is reachable by a directed path times the amount of memory required to store a delay value (either an integer or floating point value).

The present invention solves the efficiency issue of the DFS algorithm without requiring the memory allocation of the BFS algorithm. This is done by creating binary edge masks at each edge in a graph that represents a user design for a programmable IC. An edge mask indicates whether the edge leads to particular source and destination registers in a graph. By using the edge masks of the present invention, a timing analysis tool can perform depth first searches that only analyze paths leading to the relevant source and destination registers. The edge masks of the present invention greatly reduce the time and computing resources needed to perform timing analysis on a placed user design for a programmable IC.

Figure 2:
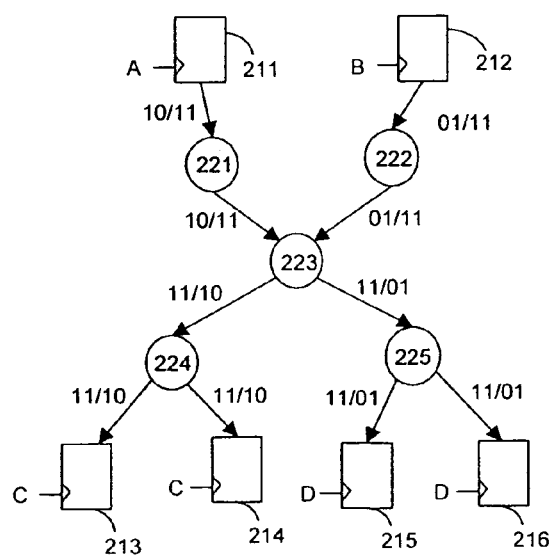
FIG. 2 is an example of a graph of a user design for a programmable integrated circuit that contains edge nodes according to the principles of the present invention.

FIG. 2 illustrates an example of how the edge mask techniques of the present invention can be applied to a graph. The graph shown in FIG. 2 represents a portion of a user design for a programmable integrated circuit. Registers 211 and 212 are source registers, and registers 213-216 are destination registers. Clock signal A clocks register 211, clock signal B clocks register 212, clock signal C clocks registers 213-214, and clock signal D clocks registers 215-216. Nodes 221-225 connect paths between registers 211-216.

Edge masks of the present invention are shown next to each edge in FIG. 2. Each edge mask indicates whether source and destination registers in the graph can be reached from that edge via a directed path. Each edge mask in the exemplary graph of FIG. 2 includes four binary bits in the format of xx/xx.

For example, the two edges between register 211 and node 223 are marked with an edge mask of 10/11. The first bit refers to source registers that can receive data from a register clocked by clock signal A (e.g., register 211). The second bit refers to registers that can receive data from registers clocked by signal B (e.g., register 212). The third bit refers to registers that feed registers clocked by clock signal C (e.g., registers 213-214). The fourth bit refers to registers that feed registers clocked by clock signal D (e.g., registers 215-216).

Edge masks of the present invention can be generated by exploring a graph in both directions of the edge arrows. First, the present invention begins at a source register such as register 211, and executes depth-first search to destination registers. At the destination register, the destination edge-mask is set for that register. On the return path the bit-masks are combined with logical-OR. For example, the destination bit-mask of edges (221,223) and (222,223) is 11, which is the logical-OR of 01 on (223,225) and 10 on (223,224)—since 223 can get to a D register via 225 and a C register via 224. Source edge-masks are defined similarly by DFS from destination registers to source registers.

Some of the edges lie along paths that lead to a destination register controlled by a particular clock signal (such as clock C). A 1 bit is stored in the edge masks for the edges that lead to registers controlled by clock signal C. Other edges do not lie along paths that lead to a destination register that is controlled by that particular clock signal. A 0 bit is stored in the edge masks for the edges that do not lead to a register controlled by clock signal C.

The present invention explores every path from the source register to a destination register moving in the signal direction of the arrows. A bit is stored in the edge mask for each edge in these paths. The bit indicates whether the edge leads to a destination register that receives a particular clock signal. This process is repeated for each source register.

Then, the process is repeated again starting at each destination register and ending at each source register, moving only in the opposite direction of the edge arrows. A bit for each source register clock signal is added to the edge mask for each edge. Each bit in the edge mask indicates whether that edge lies along a path leading to a source register controlled by a particular clock signal.

For example, a 1 bit is stored in the edge masks for the edges that lead to source registers controlled by clock signal A, and 0 bit is stored in the edge masks for the edges that do not lead to source registers controlled by clock signal A. One bit is stored in each edge mask for each unique clock signal that controls a source or a destination register in the graph. For example, the edge masks in FIG. 2 each include 4 bits (e.g., 10/11) that respectively corresponding to registers controlled by clock signals A, B, C, and D.

According to another embodiment of the present invention, each multi-cycle of clock signal is treated as a separate clock signal domain. A multi-cycle clock signal is a specification that allows a lower frequency or a higher frequency version of a clock signal in certain portions of a user design. A multi-cycle clock signal is like a separate clock signal that happens to be dependent on the frequency of the first clock signal. Each multi-cycle clock is treated as if it were a separate clock signal when calculating edge masks and performing depth first searches according to the present invention.

FIG. 3 illustrates some of the advantages of the edges masks of the present invention. The graph shown in FIG. 3 includes source registers 311-312 controlled by clock signals A and B, respectively. Destination registers 313-314 are controlled by clock signals C and D, respectively. The graph also includes node 315 and a cluster of 10,000 other nodes that are collectively referred to as node network 316.

The present invention initially scans every forward path from each source register to each destination register. Edge masks are created at each edge to indicate whether the edge leads to a destination register clocked by clock signals C or D. The present invention then scans every reverse path from each destination register to each source register. Edge masks are created at each edge to indicate whether the edge leads to a source register clocked by clock signals A or B.

For example, the present invention creates an edge mask with a value of 01/11 for the edge between register 312 and node 315. Bits 01 indicate that this edge does not lead to a source register controlled by clock A in the reverse direction, but does lead to a source register controlled by clock B in the reverse direction.

The present invention creates an edge mask with a value of 10/11 for the edge between node 315 and network 316. Bits 10 indicate that this edge leads to a source register controlled by clock A in the reverse direction, but does not lead to a source register controlled by clock B in the reverse direction.

The edge masks of the present invention allow a timing analysis tool to more efficiently analyze a graph of a user design. For example, if a user constraint is associated with clock signals B and D, timing analysis can be performed at edges between registers 312 and 314. To perform timing analysis on the edge between node 315 and register 314, a depth first search (DFS) is performed in the reverse direction starting from this edge and ending at source registers that receive clock B.

To perform the DFS, the timing analysis tool explores all of the edges that input into node 315. The edge from register 312 to node 315 has an edge mask value of 01/11, indicating that this edge leads to a destination register (312) controlled by clock B. On the other hand, the edge from node network 316 to node 315 has an edge mask value of 10/11, indicating that this edge does not lead to a destination register controlled by clock B.

Therefore, the timing analysis tool does not waste time and processing resources performing timing analysis on the 10,000 nodes in node network 316 in order to perform a DFS for the user constraint related to clocks B and D. As this example illustrates, the present invention provides faster and more efficient techniques for performing timing analysis on graphs that the represent user designs for programmable ICs.

A multi-cycle assignment is a special type of constraint, common in timing analysis tools. In the example, of FIG. 1, even though all registers are clocked by CLK, it is reasonable for the circuit to correctly operate even if paths from 132 to 134 take two clock cycles to propagate. This is due to information that the designer is aware of that is not available in the graph itself. The designer expresses this to the tool by stating that the global clock constraint is 10 ns, but the tool should execute a multicycle (132,134,2), meaning that any paths from 132 to 134 are permitted 2 cycles, or 20 ns delay.

According to an embodiment of the present invention, each multi-cycle of clock signal is treated as a separate clock signal domain. A multi-cycle clock signal is as a separate clock signal that happens to be dependent on the frequency of the first clock signal. Each multi-cycle clock is treated as if it were a separate clock signal when calculating edge masks and performing depth first searches according to the present invention.

Figure 4:
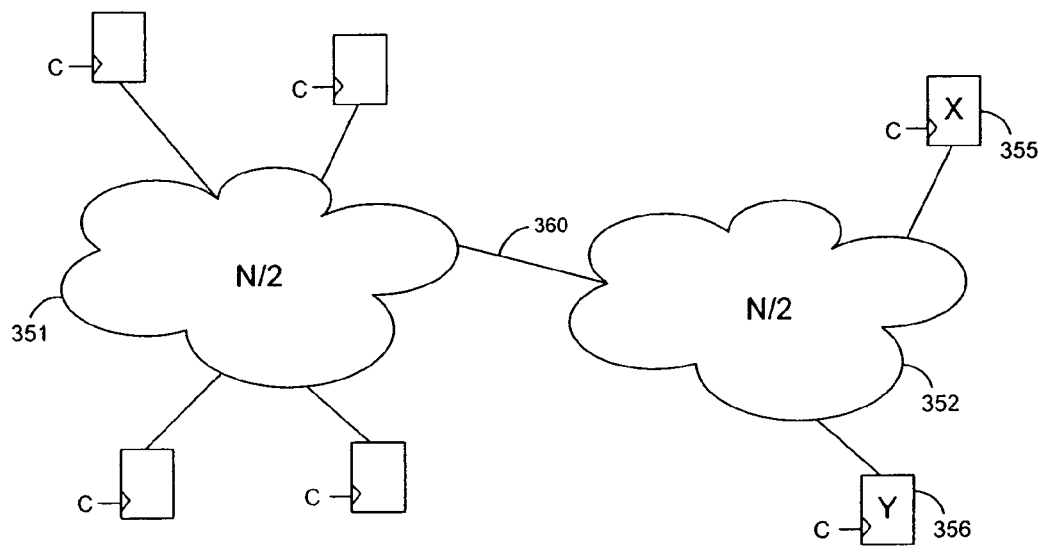
FIG. 4 is an example of a graph of a user design for a programmable integrated circuit illustrating edge-masks annotating the processing of a multicycle constraint according to the principles of the present invention.

FIG. 4 is a graph that illustrates the annotation of edge masks on a timing graph that contains a multi-cycle constraint according to an embodiment of the present invention. In FIG. 4 a plurality of registers are coupled to node networks 351 and 352 in a timing graph. Each network 351 and 352 contains half N/2 of the nodes in the graph. Each of the registers is controlled by clock signal C. Register X 355 and register Y 356 are coupled to network 352.

A multi-cycle path functions as two clock domains. Even though all of the registers in FIG. 4 are clocked by clock C, the multicycle of 2 between registers 355 and 356 means that the problem reduces to two related clock signals. In FIG. 4, 360 is an edge between node networks 351 and 352.

In the processing of a multicycle constraint, a method according to the principles of the present invention is to define two source and destination edge-mask types, one for the base-case timing graph, and a second for the multicycle portion of the timing graph. Sources from the multicycle sources are masked out ('0') of the general graph, and included in the multicycle graph by masking them in ('1').

A cut-path assignment is an additional constraint common in timing analysis tools. A cut-path constraint indicates that paths from a given set of source registers to a given set of destination registers is irrelevant for timing analysis. Using edge masks, a cut-path is treated as a multicycle in which the period of the multicycle is infinite. In this situation, the special case edge-mask need not be stored, but the base-case is modified appropriately.

The modification to the standard algorithm to process timing analysis in the principle of the current invention of edge masks is small but powerful. When executing the DFS in Algorithm B, we first check the edge-mask of each fanin/fanout before recursively executing DFS. If the edge mask is incorrect for the constraint currently being analyzed we do not follow that fanin/fanout. The abstract compilation time required to execute timing analysis on a given constraint is equal to the number of nodes relevant to that constraint plus a proportional number of neighbors. This is identical to the compilation time of the BFS algorithm, but does not require memory to be allocated at each node. Further benefits of edge masks will be become apparent in subsequent discussion.

Figure 5:
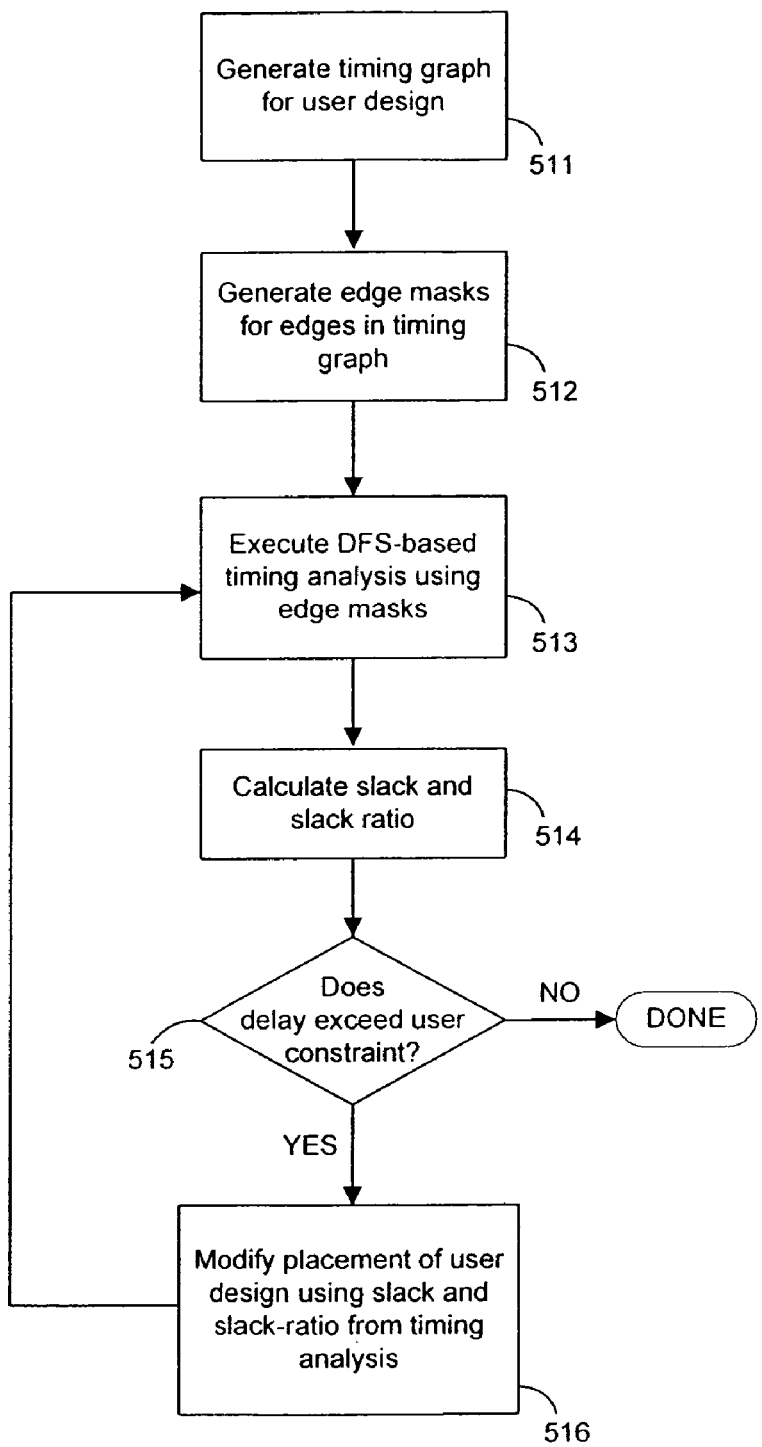
FIG. 5 is a flow chart that illustrates a process for performing timing analysis of a user design for a programmable integrated circuit using a graph with edge masks according to an embodiment of the present invention.

FIG. 5 illustrates a generalized process for performing timing analysis and placement on a graph according to an embodiment of the present invention. At step 511, a graph is created that represents a user design that has been placed on a programmable IC (e.g., an FPGA or a PLD). At step 512, edge masks are created for each edge in the graph, as discussed in the examples above. At step 513, a time analysis tool performs depth first searches along time critical paths between source and destination registers that are relevant to a user timing constraint using edge-masks to efficiently DFS the graph. The edge masks prevent the timing analysis tool from analyzing paths that do not lead to the relevant source and destination registers.

At step 514, the timing analysis tool calculates the slack values and slack ratios for edges in the time critical paths. A slack value indicates whether the delay along a time critical path in the placed user design exceeds a user timing constraint for that path, and a slack-ratio provides relative information on which edges are important to modify in future placement steps.

If a slack value indicates that the delay along a time critical path exceeds a user timing constraint at step 515, the placement tool re-places a portion or all of the user design at step 516. The placement tool places circuit elements in the user design into different logic element on the programmable IC based on the slack-ratios to improve the delay along the time critical path. Timing analysis is then repeated starting at step 513 to determine if the newly placed user design satisfies the user's timing constraints. If the slack values indicate that the delay along the time critical paths do not exceed the user timing constraint at step 515, the process terminates.

In a further embodiment of the present invention, edge-masks can be used to perform correct timing analysis in the presence of thru-x multicycle constraints. A thru-x constraint is similar to a multicycle constraint except that it is triggered on an internal node rather than on the source and destination. Using FIG. 1 as an example, a user may specify that all paths from 132 to 134 have a multicycle of 2 when they pass through node 116; syntactically MC-thru (132,134,2,116). As multicycles do, this constraint/exclusion generalizes to sets of nodes rather than a specific node.

Edge masks allow timing analysis in the presence of thru-x-multicycle constraints via the following method: Duplicate the clock domain to use two source and two destination mask bits. The first source and first destination correspond to the general case of paths from 132 to 134, and the second source and second generation to the thru-x case of paths from 132 to 134. To ensure that 116 (x) is never considered in the general case, zero-out the bit-mask in all directly adjacent nodes to it. To compute the bit-masks for the thru-x constraint itself, execute the source and destination DFS directly from x itself, since x is a graph-theoretic cut-node in the resulting timing analysis graph. Equivalently, create a trigger edge mask, which turns on the calculation of the thru-x bit—when x is traversed, turn on the x bit in the trigger mask, and when returning from the DFS and setting edge masks, AND the bit-mask for all thru-x constraints with the trigger bit indicating that the DFS came through x.

FIG. 6A shows an example of an original timing graph, and FIGS. 6B and 6C show the two sub-graphs formed from the analysis of the original graph with MC(B,D,2) and MC-thru (B,D,2,x). For illustration, these are shown as separate graphs rather than using their edge-masks.

The graph shown in FIG. 6A includes source registers 611 and 612 and destination registers 613 and 614. The graph also includes nodes A-M and node X 620. The graphs of FIGS. 6B and 6C include sub-portions of the graph shown in FIG. 6A. The graph in FIG. 6B includes source register 612, destination register 614, and nodes B-J and node L (not node X 620). The graph in FIG. 6C includes source register 612, destination register 614, and nodes B, D, E, F, H, X 620, and L.

In the graphs of FIGS. 6A-6C, there is a single clock signal C. A multicycle of 2 exists between registers 612 and 614. Paths between registers 612 and 614 that traverse node X 620 have a multicycle of 3.

The timing analysis reduces into a number of timing analysis abstract clock domains. The first analysis is performed on the thru-X multicycle 3 clock domain in FIG. 6C. Three source edge mask bits indicate whether it is possible to reach from an edge (1) any C-clock source point, (2) C-clock source point 612, and (3) C-clock source point 612 through node X 620. Three destination edge mask bits indicate whether it is possible to reach from an edge (1) any C-clock destination point, (2) C-clock destination point 614, and (3) C-clock destination point 614 through node X 620.

The graph of FIG. 6C shows the induced sub-graph for edge masks 111 and 111. FIG. 6B shows the induced sub-graph for edge masks 110 and 110. In FIG. 6B, the edges adjacent to node X are excluded by the final 0 bit, and each of these 3 edges are shown as dotted lines.

Based on the number of constraints that the user applies to the timing graph, the size of the edge-mask could be relatively large. This is less important in terms of memory use (since edge masks require only one bit vs. approximately 100 times that number for storing the values in the BFS method), it is relevant to execution time required to maintain the bit-mask structure. In a further embodiment of the present invention, a small number of bits of the edge-mask can be used to distinguish the most important portions of the graph, and that a single "super bit-mask" can be used to represent all other source or destination types. According to this method, some duplicate analysis is performed on the constraint types which involve small portions of the timing graph, while reduced computation can apply to all other portions of the timing graph.

It is well-known to those skilled in the art that the typical timing graph contains very few edges which are truly critical, and a small number of edges which are critical. Thus it would be desirable to be able to identify specific portions of the timing graph which need to be explored, and others which do not need to be explored in order to execute the next step of placement as illustrated in FIG. 5.

According to another embodiment of the present invention, edge masks can be used to mask out unimportant portions of the timing graph and further improve the overall execution time of timing analysis and hence placement of a user design into a target programmable logic device. This is accomplished by post-processing the timing graph after the first timing analysis. For a given large portion of the timing graph and source/destination edge-mask pair x/y for that portion of the timing graph, one new source/destination edge-mask pair x' and y' is created, making the edge mask xx'/yy'. Edges which had a '1' in the x (y) position are split into those with high slack ratio (corresponding to unimportant edges for timing analysis) 10/10 and those with relatively low slack ratio (indicating critical edges) 01/01. Commonly executed timing analysis would then follow only the more critical sets of edges and not explore the portion of the graph represented by the high-slack-ratio edges. The placement algorithm could choose to execute a "full" timing analysis periodically in which these edge-masks are updated appropriately in case the situation of high-slack-ratio and low-slack-ratio edges were to change during placement.

Other benefits are available to a placement tool which calls timing analysis under the principles of this invention as a subroutine. Because nodes moved are marked with their edge-masks, a counter of the number of nodes that have been touched within each constraint domain can be kept. According to a further embodiment of the present invention, the interaction of the placement tool with timing analysis can be changed so that the placement tool requests timing analysis only on a given "dirty" constraint domain, and does not re-analyze domains that have not been changed.

It is common, for debug purposes, for the user of a timing analysis tool to want a description of the "k most critical paths" in order to target their work to the most critical portions of the design for structural improvements.

Algorithm C shows pseudocode for a DFS-based algorithm to compute the number of paths in a graph in which each individual edge participates.

Algorithm C:
For each delay source x
   x.paths_from=1
   DFS from delay destinations. On the way back, compute
     x.paths_from=sum(y.paths_from) for all fanins y of x
   Same in reverse gives x.paths_to
   For any edge e, the number of paths e exists on is the
     product of e.paths_to e.paths_from.
   For G, the number of paths is the sum, over all delay
     destinations x, of x.paths_from (equivalently sum of
     delay sources of x.paths_to).

Algorithm C follows the structure of Algorithm A, where at each node the number of paths from a source is the sum of the number of paths from a source to each of its fanin nodes, and the number of paths to a destination is the sum of the number of paths from each of its fanout nodes to a destination. The number of paths involving the edge e is then the product of these two values. Given a graph annotated in this way, the total number of paths in the graph is the sum of the number of paths involving each destination node (equivalently, source node). In general, the number of such paths is exponential in the number of nodes; no efficient tool could ever enumerate and sort the list of all paths as a method of finding the k most critical.

According to a further embodiment of the present invention, edge masks can be used to prune this graph to the point where there are only the k most critical paths remaining, and then efficiently output those paths. Algorithm D includes pseudocode for pruning a timing graph annotated with the number of paths until the number of paths is a user-requested value k.

Algorithm D:
npaths=#(G)
While npaths>k
  Choose highest slack edge e and mask it.

$npaths=npaths-e.num\_paths.$

Re-compute npaths and start over

Knowing the number of paths in the graph from Algorithm C, the number of paths e.num_paths through each node e also, and knowing slack from timing analysis, we remove the highest (least critical edge) by setting its edge-mask from '1' to '0'. This removes at most e.num_paths from the graph. The method will continue this process until the count of potentially removed paths is less than 'k', then add back the last edge, re-process the counting algorithm, and continue. This efficiently computes the k most critical paths in no more than quadratic time in the number of edges, and in practice linear time in the number of edges.

One of the specific advantages of this method is that, because we have edge-masks for all potential source-destination combinations relevant to the user constraints, we can immediately generalize the algorithm to operate within each different constraint domain, thus outputting the k most critical paths relevant to each constraint.

Therefore, the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A method for performing timing analysis on a user design that has been placed on a programmable integrated circuit, the method comprising:
   generating edge masks to annotate edges in a graph that represents at least a portion of the user design, the edge masks indicating whether a source or destination point is reachable from a corresponding one of the edges;
   performing at least one depth first search along a time critical path in the graph between the source and the destination points, the at least one depth first search being prevented by the edge masks from analyzing paths that do not lead to the source point or the destination point; and
   modifying the placement of the user design on the programmable integrated circuit in response to the at least one depth first search.

2. The method of claim 1 wherein generating the edge masks further comprises generating a first type of edge mask that represents reachability from the source point in a backwards direction, and a second type of edge mask that represents reachability to the destination point in a forward direction.

3. The method of claim 2 wherein generating the edge masks further comprises generating binary bits that correspond to specific types of source points and destination points in a list of constraints.

4. The method of claim 3 wherein performing the at least one depth first search further comprises performing multiple depth first searches in the presence of multiple constraints on timing analysis, wherein source edge-masks correspond to source-types in timing constraints and source types correspond to source edge-masks.

5. The method of claim 4 further comprising:
   converting multicycle constraints on timing analysis to two edge-mask sets, one for a base case and another for a multicycle case.

6. The method of claim 5 wherein cut-path constraints on timing analysis are treated as multicycle constraints with an infinite multicycle period.

7. The method of claim 4 further comprising:
   converting thru-x constraints into multiple edge-mask sets indicating a base case and a multicycle case, the multicycle case by masking out edges immediately adjacent to node x in the base case.

8. The method of claim 3 wherein the resulting timing analysis is used in combination with a placement algorithm to effect a modified placement of critical edges.

9. The method of claim 8 wherein generating the edge masks further comprises generating additional edge masks to represent critical and non-critical portions of a netlist for the user design, and the method further comprises:
   applying timing analysis on the critical portion of the netlist with greater frequency; and
   applying timing analysis on the non-critical portion of the netlist less frequently.

10. The method of claim 3 wherein generating the edge masks further comprises generating one or more super-edge masks that are used to represent multiple constraint types merged into a single constraint.

11. The method of claim 2 further comprising:
    annotating the graph with a number of paths that pass each of the edges; and
    successively pruning each edge, by setting the edge masks, until only k paths remain to be reported to a user of a timing analysis tool, where k is a number.

12. The method of claim 11 wherein information reported to the user is a set of k most critical paths within each constraint domain, reported separately.

13. The method of claim 12 wherein the number, k, is different for each constraint domain.

14. A computer system for implementing timing analysis on a user design that has been placed on a programmable integrated circuit, the computer system comprising:
    code for generating edge masks to annotate edges in a graph that represents at least a portion of the user design, the edge masks indicating whether a source point and a destination point are reachable from a corresponding one of the edges;
    code for performing at least one depth first search along a time critical path in the graph between the source point and the destination point, the at least one depth first search being prevented by the edge masks from analyzing paths that do not connect the source and destination points; and a computer readable medium that stores the codes.

15. The computer system according to claim 14 wherein the code for generating the edge masks further comprises code for generating a first type of edge mask that represents reachability from the source point in a backwards direction, and a second type of edge mask that represents reachability to the destination point in a forward direction.

16. The computer system according to claim 15 wherein the code for generating the edge masks further comprises code for generating binary bits that correspond to specific types of source points and destination points in a list of constraints.

17. The computer system according to claim 15 further comprising:
   code for annotating the graph with a number of paths that pass each of the edges; and
   code for successively pruning each edge, by setting the edge masks, until only k paths remain to be reported to a user of a timing analysis tool, where k is a number.

18. The computer system according to claim 16 wherein the code for performing the at least one depth first search further comprises code for performing multiple depth first searches in the presence of multiple constraints on timing analysis, wherein source edge-masks correspond to source-types in timing constraints.

19. The computer system according to claim 16 wherein the code for generating the edge masks further comprises code for generating one or more super-edge masks that are used to represent multiple constraint types merged into a single constraint.

20. The computer system according to claim 16 wherein the code for generating the edge masks further comprises code for generating edge masks to represent critical and non-critical portions of a netlist for the user design, and the computer system further comprises:
   code for applying timing analysis on the critical portion of the netlist with greater frequency; and
   code for applying timing analysis on the non-critical portion of the netlist less frequently.

21. The computer system according to claim 18 further comprising:
   code for converting multicycle constraints on timing analysis to two edge-mask sets, one for a base case and another for a multicycle case.

22. The computer system according to claim 18 further comprising:
   code for converting thru-x constraints into multiple edge-mask sets indicating a base case and a multicycle case, the multicycle case by masking out edges immediately adjacent to node x in the base case.

23. The computer system according to claim 21 wherein cut-path constraints on timing analysis are treated as multicycle constraints with an infinite multicycle period.

24. The computer system according to claim 14 wherein the code for performing the at least one depth first search further comprises code for performing multiple depth first searches in the presence of multiple constraints on timing analysis, wherein source edge-masks correspond to source-types in timing constraints.

25. The computer system according to claim 14 wherein the code for generating the edge masks further comprises code for generating one or more super-edge masks that are used to represent multiple constraint types merged into a single constraint.

26. The computer system according to claim 14 wherein the code for generating the edge masks further comprises code for generating edge masks to represent critical and non-critical portions of a netlist for the user design, and the computer system further comprises:
   code for applying timing analysis on the critical portion of the netlist with greater frequency; and
   code for applying timing analysis on the non-critical portion of the netlist less frequently.

27. The computer system according to claim 14 further comprising:
   code for annotating the graph with a number of paths that pass each of the edges; and
   code for successively pruning each edge, by setting the edge masks, until only k paths remain to be reported to a user of a timing analysis tool, where k is a number.

28. A method for analyzing a user design to be implemented as an integrated circuit, the method comprising:
   receiving a graph including nodes and edges, wherein the graph represents at least a portion of a user design;
   specifying sources and destinations in the graph, wherein each of the sources includes at least one of the nodes initiating a path and each of the destinations includes at least one of the nodes terminating a path;
   generating edge masks to annotate the edges in the graph, wherein each edge mask indicates whether the sources or the destinations in the graph are reachable via a corresponding edge;
   selecting at least one source and at least one destination for analysis; and
   analyzing a path between the selected sources and destinations, wherein the analysis comprises:
   selecting a first edge for analysis;
   performing the analysis on the selected first edge when the corresponding edge mask indicates that at least one of the selected sources and at least one of the selected destinations is reachable via the first edge; and
   ignoring the first edge when the corresponding edge mask indicates that the selected sources and selected destinations are not reachable via the first edge; and
   modifying the implementation of the user design on the integrated circuit in response to the analysis on the selected first edge.

29. The method of claim 28, wherein selecting the first edge includes performing at least one depth-first search from the selected sources to the selected destinations.

30. The method of claim 28, wherein selecting the first edge includes performing at least one breadth-first search from the selected sources to the selected destinations.

31. The method of claim 28, wherein generating the edge masks further comprises generating a first type of edge mask that represents reachability from the selected sources in a backwards direction, and a second type of edge mask that represents reachability to the selected destinations in a forward direction.

32. The method of claim 28, wherein the analysis includes a timing analysis.

33. The method of claim 32, wherein the timing analysis determines a slack value for the first edge.

34. The method of claim 32, wherein the timing analysis determines a slack ratio value for the first edge.

35. The method of claim 28, wherein at least one of the edge masks is associated with at least one source of a first type.

36. The method of claim 35, wherein at least one of the edge masks is associated with at least two sources of a first type.

37. The method of claim 28, wherein at least one of the edge masks is associated with at least one destination of a first type.

38. The method of claim 37, wherein at least one of the edge masks is associated with at least two destinations of a first type.

39. The method of claim 28, wherein at least one of the edge masks is associated with a first clock domain.

40. The method of claim 39, wherein the first clock domain is an inverse of a second clock domain associated with a second one of the edge masks.

41. The method of claim 39, wherein the first clock domain is a multicycle of a second clock domain associated with a second one of the edge masks.

42. The method of claim 39, wherein the first clock domain is a skewed version of a second clock domain associated with a second one of the edge masks.

43. A computer-readable storage medium including instructions adapted to direct a computer system to perform an operation comprising:
    receiving a graph including nodes and edges, wherein the graph represents at least a portion of a user design;
    specifying sources and destinations in the graph, wherein each of the sources includes at least one of the nodes initiating a path and each of the destinations includes at least one of the nodes terminating a path;
    generating edge masks to annotate the edges in the graph, wherein each edge mask indicates whether the sources or the destinations in the graph are reachable via a corresponding edge;
    selecting at least one source and at least one destination for analysis; and
    analyzing a path between the selected sources and destinations, wherein the analysis comprises:
    selecting a first edge for analysis;
    performing the analysis on the selected first edge when the corresponding edge mask indicates that at least one of the selected sources and at least one of the selected destinations is reachable via the first edge; and
    ignoring the first edge when the corresponding edge mask indicates that the selected sources and selected destinations are not reachable via the first edge.

44. The computer-readable storage medium of claim 43, wherein selecting the first edge includes performing at least one depth-first search from the selected sources to the selected destinations.

45. The computer-readable storage medium of claim 43, wherein selecting the first edge includes performing at least one breadth-first search from the selected sources to the selected destinations.

46. The computer-readable storage medium of claim 43, wherein generating the edge masks further comprises generating a first type of edge mask that represents reachability from the selected sources in a backwards direction, and a second type of edge mask that represents reachability to the selected destinations in a forward direction.

47. The computer-readable storage medium of claim 43, wherein the analysis includes a timing analysis.

48. The computer-readable storage medium of claim 47, wherein the timing analysis determines a slack value for the first edge.

49. The computer-readable storage medium of claim 47, wherein the timing analysis determines a slack ratio value for the first edge.

50. The computer-readable storage medium of claim 43, wherein at least one of the edge masks is associated with at least one source of a first type.

51. The computer-readable storage medium of claim 50, wherein at least one of the edge masks is associated with at least two sources of a first type.

52. The computer-readable storage medium of claim 43, wherein at least one of the edge masks is associated with at least one destination of a first type.

53. The computer-readable storage medium of claim 52, wherein at least one of the edge masks is associated with at least two destinations of a first type.

54. The computer-readable storage medium of claim 53, wherein at least one of the edge masks is associated with a first clock domain.

55. The computer-readable storage medium of claim 54, wherein the first clock domain is an inverse of a second clock domain associated with a second one of the edge masks.

56. The computer-readable storage medium of claim 54, wherein the first clock domain is a multicycle of a second clock domain associated with a second one of the edge masks.

57. The computer-readable storage medium of claim 54, wherein the first clock domain is a skewed version of a second clock domain associated with a second one of the edge masks.

58. A method for performing timing analysis on a user design that has been placed on a programmable integrated circuit, the method comprising:
    generating edge masks to annotate edges in a graph that represents at least a portion of the user design, the edge masks indicating whether a plurality of source and a plurality of destination points are reachable from a corresponding one of the edges;
    performing at least one depth first search along a time critical path in the graph between one of the plurality of source and one of the plurality of destination points, the at least one depth first search being prevented by the edge masks from analyzing paths that do not lead to the one of the plurality of source and the one of the plurality of destination points; and
    modifying the placement of the user design on the programmable integrated circuit in response to the at least one depth first search.

59. The method of claim 58 wherein performing the at least one depth first search further comprises performing multiple depth first searches in the presence of multiple constraints on timing analysis, wherein source edge-masks correspond to source-types in timing constraints and source types correspond to source edge-masks.

60. The method of claim 58 further comprising:
    annotating the graph with a number of paths that pass each of the edges; and
    successively pruning each edge, by setting the edge masks, until only k paths remain to be reported to a user of a timing analysis tool, where k is a number.

* * * * *

UNITED STATES PATENT AND TRADEMARK OFFICE
CERTIFICATE OF CORRECTION

| | | |
|---|---|---|
| PATENT NO. | : 7,607,118 B1 | Page 1 of 1 |
| APPLICATION NO. | : 11/475843 | |
| DATED | : October 20, 2009 | |
| INVENTOR(S) | : Michael D. Hutton | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 308 days.

Signed and Sealed this

Fourteenth Day of December, 2010

David J. Kappos
*Director of the United States Patent and Trademark Office*